United States Patent [19]

Goldberg et al.

[11] 4,048,525

[45] Sept. 13, 1977

[54] OUTPUT CIRCUIT FOR CHARGE TRANSFER TRANSVERSAL FILTER

[75] Inventors: Howard S. Goldberg, Schenectady; William E. Engeler, Scotia, both of N.Y.

[73] Assignee: General Electric Company, Schenectady, N.Y.

[21] Appl. No.: 609,496

[22] Filed: Sept. 2, 1975

[51] Int. Cl.² .................. H03K 5/20; H03K 5/08; G11C 19/28; H03H 7/10

[52] U.S. Cl. .................. 307/353; 307/221 D; 307/237; 307/355; 333/70 T; 357/24

[58] Field of Search ............ 357/24; 307/221 D, 304, 307/235 A, 235 B, 235 C, 235 F, 235 T, 246, DIG. 3, 230, 237, 351, 352, 353, 355, 362; 328/151; 333/70 T

[56] References Cited

U.S. PATENT DOCUMENTS

| | | | |
|---|---|---|---|
| 3,173,023 | 3/1965 | Talsoe | 307/237 |
| 3,463,940 | 8/1969 | Kaye et al. | 307/237 |
| 3,969,636 | 7/1976 | Baertsch et al. | 307/221 D |
| 4,004,157 | 1/1977 | Baertsch et al. | 357/24 |

Primary Examiner—William D. Larkins
Assistant Examiner—Gene M. Munson
Attorney, Agent, or Firm—Julius J. Zaskalicky; Joseph T. Cohen; Jerome C. Squillaro

[57] ABSTRACT

The output circuit includes a high gain differential amplifier having an inverting input terminal, a non-inverting input terminal and an output terminal with a feedback capacitance connected between the output terminal and the inverting input terminal. The input terminals are connected to first and second commonly phased lines of the charge transfer transversal filter. A first switchable impedance means is connected between the first line and the output terminal. A second switchable impedance means is connected between the second line and a d-c source of voltage. The lines are charged periodically to the voltage of the source by the first and second switchable impedance means prior to the transfer of charge in a cycle of operation of the filter and are then isolated from the source during the transfer of charge in the filter by the first and second switchable impedance means.

6 Claims, 5 Drawing Figures

OUTPUT CIRCUIT FOR CHARGE TRANSFER TRANSVERSAL FILTER

The present invention relates in general to differential sensing circuits and in particular to differential read out circuits for use with charge transfer transversal filters in which split electrodes are utilized to provide weighting in the various stages thereof.

This application is related to patent application Ser. No. 609,497 filed concurrently herewith and assigned to the assignee of the present invention. The aforementioned application Ser. No. 609,497 is incorporated herein by reference thereto.

A charge transfer transversal filter comprises a serial organization of N stages of closely coupled MOS (Metal-Oxide-Semiconductor) capacitors. Charge packets representing sequential samples of an analog signal are serially inserted into the filter and are clocked at a rate $f_c = 1/T_c$ per sec, where $T_c$ is the period of the sampling, along the N stages of the filter. A charge packet emerges from the last stage $NT_c$ seconds after introduction or insertion into the filter. The filter includes means for non-destructively measuring and weighting the signal samples at each of the stages. The measuring and weighting of the signal samples simultaneously in all stages is achieved by setting the value of the capacitors, on which the signal samples are stored according to the desired tap weights. Tap weights are implemented in each of the stages by splitting the commonly phased electrodes of the capacitors of the stages into a A side or part and a B side or part. The A sides of the electrodes are connected together and to a first commonly phased line, and also the B sides of the electrodes are connected together and to a second commonly phased line. An electrode with a split at the center corresponds to a tap weight of zero. An electrode split such that the active portion of the electrode is connected to only the first commonly phase line corresponds to a tap weight of −1. An electrode split such that the active portion of the electrode is connected to only the second commonly phased line corresponds to a tap weight of +1. An electrode split at an intermedite point would provide a corresponding intermediate tap weight.

With such a means for providing tap weights, in order to obtain a sum of the weighted samples, the negatively weighted samples are summed on the first line and the positively weighted samples are summed on the second line. A differential amplifier connected to the first and second lines is utilized to obtain the net sum. Thus a surface charge transversal filter, such as described above, generates an output signal $S_{out}(t)$ which is the convolution of N samples of an input signal $S_{in}(t)$ with a set of N weighting factors ($W_n$) referred to as tap weights. The foregoing statement may be expressed mathematically as follows:

$$S_{out}(t) = \sum_{n=1}^{N} W_n S_{in}(t - nT_c). \tag{1}$$

The filter response is determined entirely by the choice of the set of N tap weights $W_n(n=1, N)$. If a particular response is desired it may be approximated by choosing the N tap weights appropriately.

The present invention is directed to the provision of a differential read out circuit in a split electrode charge transfer transversal filter which is simple and effective and provides an accurate measure of the difference in charge transferred on the two sides of the split electrode system.

Another object of the present invention is to provide a differential output circuit which allows essentially the maximum time for the amplifier of the circuit to respond and thereby to impose a minimum requirement on amplifier performance.

Another object of the present invention is to provide a differential output circuit which uses a minimum of electrical components and interconnections therebetween.

Another object of the present invention is to provide a differential output circuit which uses a minimum of electrical components and interconnections therebetween.

Another object of the present invention is to provide a differential read out circuit in which circuit noise is minimized over prior art read out circuits.

A further object of the present invention is to provide improvements in charge transfer transversal filters.

In carrying out the invention in an illustrative embodiment there is provided a substrate of semiconductor material of one conductivity type. A first plurality of electrodes insulatingly overlie the substrate, each electrode being split into a first and a second part with a gap therebetween. A second plurality of electrodes insulatingly overlie the substrate, each electrode being spaced between adjacent electrodes of the first plurality. The first and second pluralities of electrodes form a plurality of stages of a shift register. Means are provided for connecting the first parts of the electrodes of the first plurality to a first conductive line. Means are provided for connecting the second parts of the electrodes of the first plurality to a second conductive line. Means are provided for introducing packets of charge repesenting successive samples of an analog signal into the shift register. Charge clocking means are provided to effect the transfer of charge from storage region to storage region underlying the first and the second pluralities of electrodes including means for applying first and second phase related voltages to the first and the second pluralities of electrodes respectively, the first voltage being applied to the first and second lines, the second voltage having a predetermined periodicity.

Differential sensing means are connected to the first and second lines for detecting a difference in signal on the lines in response to the transfer of charge from storage regions underlying the second plurality of electrodes to storage regions underlying the first plurality of electrodes for obtaining a sum of weighted samples of the analog signal. The differential sensing means includes a high gain differential amplifier having a pair of input terminals and an output terminal, one of the input terminals being an inverting input terminal and the other being a non-inverting terminal. A first capacitor is connected between the inverting terminal and the output terminal. The inverting terminal is connected to the first line and the non-inverting terminal is connected to the second line. A source of a first phase related voltage is provided. A first switchable impedance means is connected between the first line and the output terminal. A second switchable impedance means is connected between the second line and a d-c source of voltage. The lines are charged periodically to the voltage of the source by the first and second switchable impedance means prior to the transfer of charge in a cycle of operation of the filter and are then isolated from the source during the transfer of charge in the filter by the first and second switchable impedance means. Accordingly, charge periodically transferred from the storage regions underlying the second plurality of electrodes to storage regions underlying the first plurality of electrodes induces different voltages on the lines. The amplifier causes the voltage of the inverting terminal to follow the voltage of the non-inverting terminal by virtue of the feedback through the first capacitor. Thus, a total charge is supplied to the first capacitor which is proportional to the difference in charge delivered to the lines during the transfer of charge, the total charge appearing as a change in voltage at the output terminal.

The features which are believed to be characteristic of the present invention are set forth with particularity in the appended claims. The invention itself, both as to its organization and method of operation, together with further objects and advantages thereof may best be understood by reference to the following description taken in connection in the accompanying drawings wherein:

Figure 1:
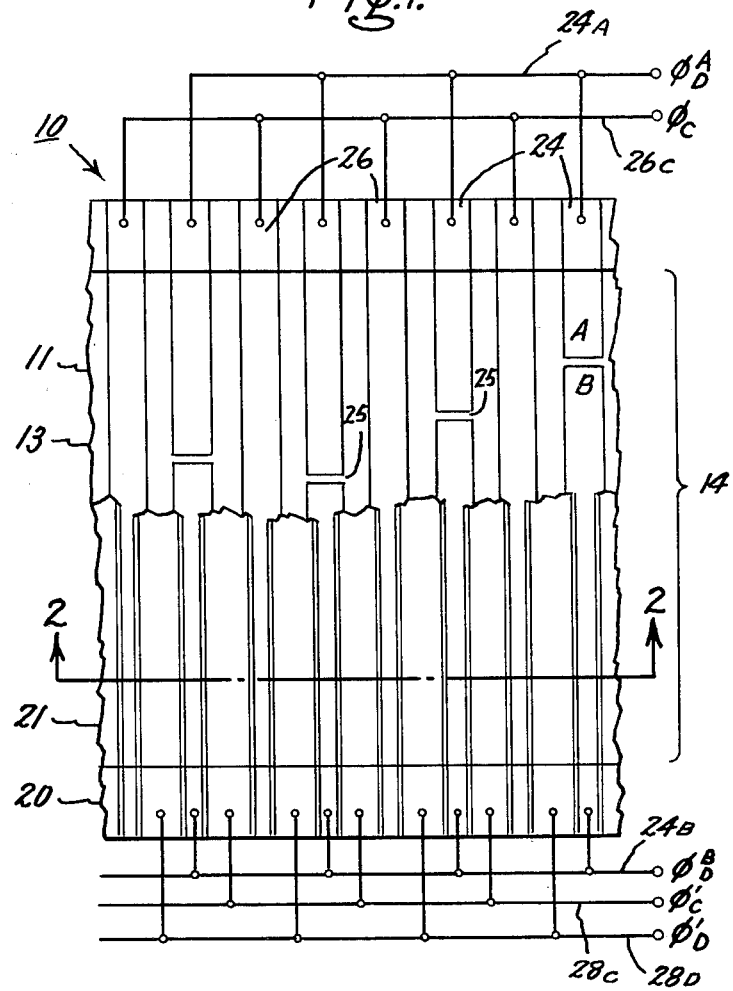
FIG. 1 shows a plan view of a charge transfer device with split electrodes connected to provide transversal filtering.
Figure 2:
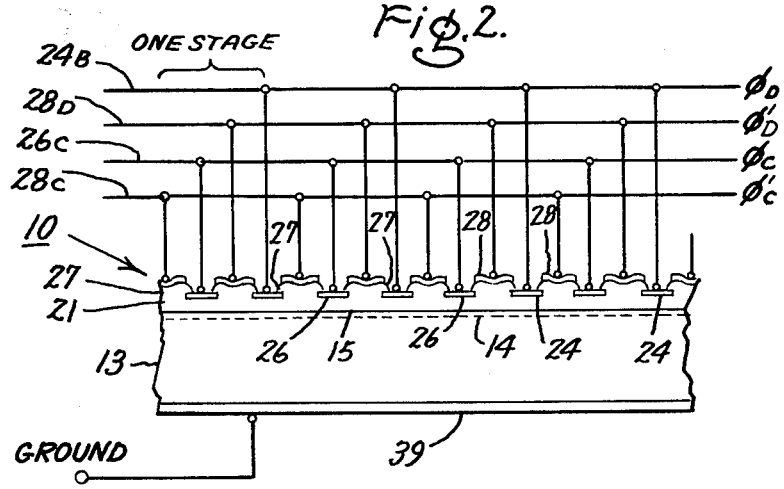
FIG. 2 is a sectional view of FIG. 1 taken along sectional lines 2—2 of FIG. 1.

Reference is now made to FIGS. 1 and 2 which show a portion of a transversal filter 10 including a charge coupled shift register 11. The shift register 11 is formed on a substrate 13 of N-type conductivity silicon material which has a channel portion 14 of uniform width adjacent a major surface 15 of the substrate. Overlying the major surface of the substrate 13 is a thick insulating member 20 of silicon dioxide having a thin portion 21 of generally rectangular outline and lying in registry with the channel portion 14 of the substrate. A first plurality of electrodes 24 are provided on the insulating member 20 overlying the thin portion 21 thereof and orthogonal to the length thereof. Each of the electrodes 24 is of uniform length in the direction of the length of the semiconductor channel portion 14 and each of the electrodes 24 extends across the thin insulating portion 21 of the insulating member as well as over the bordering thick insulating portions of the insulating member 20. Each of the electrodes 24 of the first plurality has a split or gap 25 across the short dimension thereof over the first channel portion which divides the electrode into a first or A part and a second or B part.

The gap or split 25 in each of the electrodes 24 is small to allow the depletion regions or potential wells under the A and B parts to be coupled together efficiently to enable charge transferred to two potential wells under each electrode 24 to equilibrate, i.e. the charge density under the A and B parts of the electrode is identical. Preferably, regions of P-type conductivity are provided underlying each of the gaps 25 to enable the conduction of charge between adjacent potential wells of a split electrode 24 of the shift register, as is more fully described and claimed in a copending application Ser. No. 609,414 filed concurrently herewith and assigned to the assignee of the present invention. The aforementioned application is incorporated herein by reference thereto.

A second plurality of electrodes 26 which are unsplit are provided on the insulating member 20 overlying the thin portion 21 thereof and orthogonal to the length thereof. Each of the electrodes 26 is of uniform length in the direction of the length of the channel portion 14 and equal to the uniform length of each of the electrodes 24 of the first plurality. Each of the electrodes 26 of the second plurality are spaced between adjacent electrodes 24 of the first plurality and each extends completely over the thin insulating portion of the insulating member 20 as well as the bordering thick insulation portions of the insulating member 20. An insulating layer 27 is provided over the electrodes 24 and 26 of the first and second plurality. A plurality of transfer electrodes 28 are provided over the insulating layer 27, each of the transfer electrodes being insulatingly spaced between adjacent electrodes of the first and second pluralities and overlying the adjacent members thereof. Each of the transfer electrodes 28 is of substantially uniform extent in the direction of the length of the channel portion 14 and each electrode 28 extends entirely over the thin insulating portion 21 of the insulating member 20 as well as the bordering thick insulating portions thereof.

Figure 3:
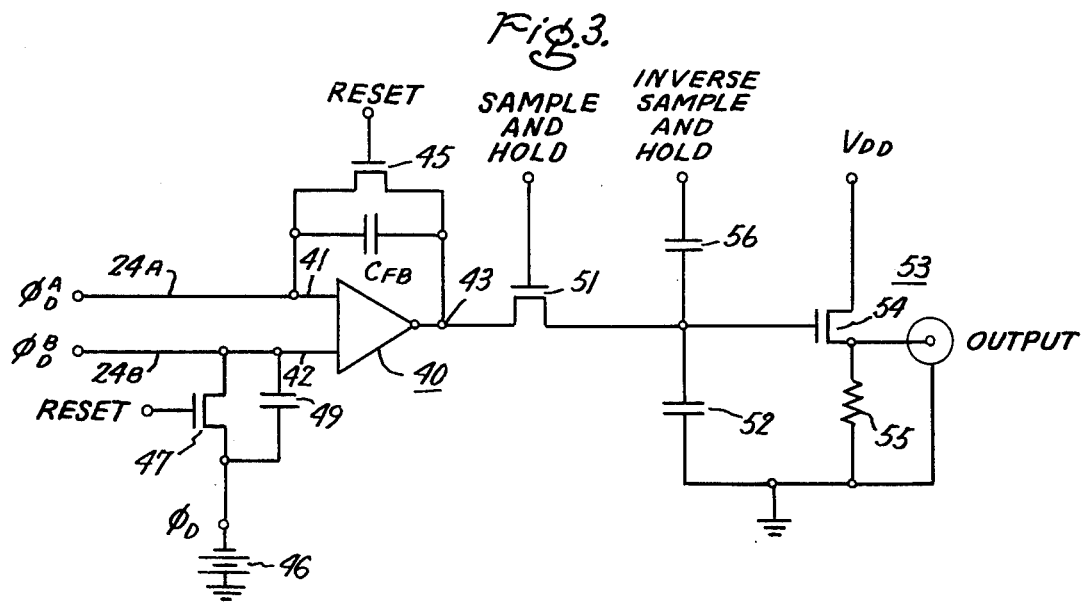
FIG. 3 is a schematic diagram of the differential sensing circuit in accordance with the present invention.
Figure 4:
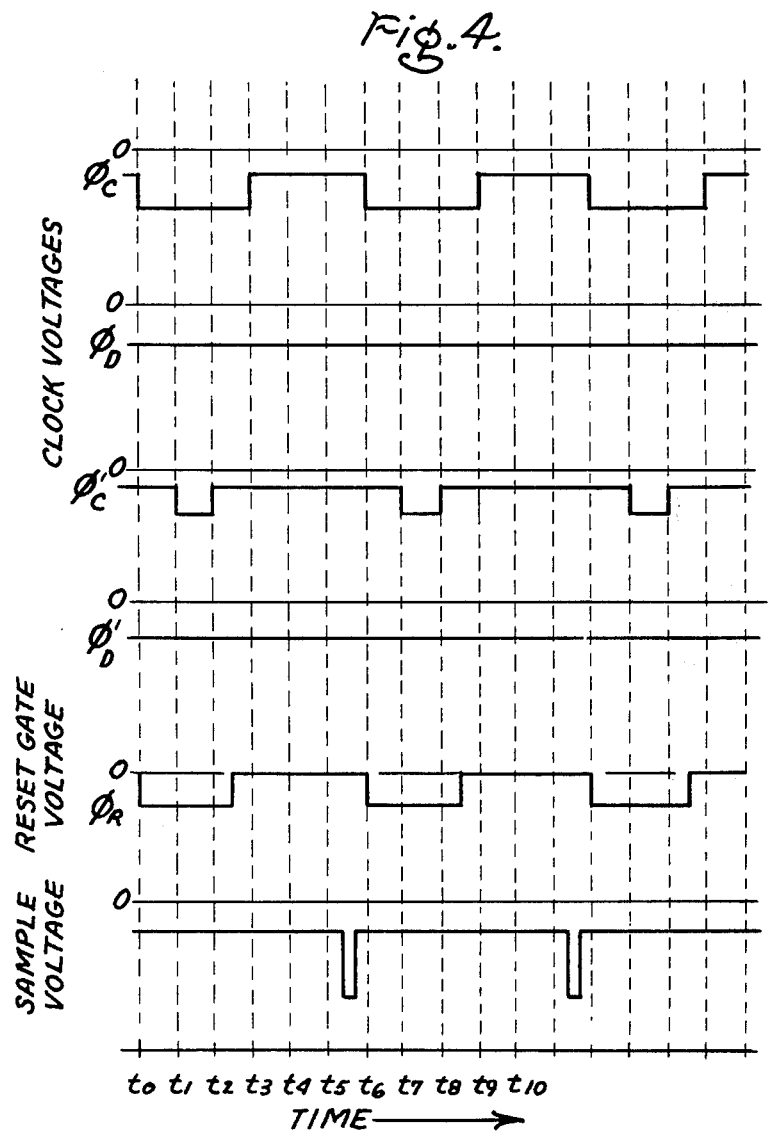
FIG. 4 is a diagram of voltage waveforms useful in explaining the operation of the transversal filter apparatus of the invention.

All of the A or first parts of the electrodes 24 of the first plurality are connected to a common line 24A to which a $\phi_D$ voltage, $\phi_D{}^A$, is applied through the circuit of FIG. 3. All of the B or second parts of the electrodes 24 of the first plurality are connected to a common line 24B to which a $\phi_D$ voltage, designated voltage $\phi_D{}^B$, is applied through the circuit of FIG. 3. The manner of application of the 100 $_D$ voltage will be explained in connection with FIG. 3. All of the second plurality of electrodes 26 are connected to a common line 26C to which a voltage $\phi_C$ is applied which is shown in FIG. 4. All of the transfer electrodes 28 immediately preceding the split electrodes 24, that is on the input side thereof, are connected to a common line 28D. All of the transfer electrodes 28 located on the output side of the conductor members of the first plurality are connected to a common line 28C. A conductive layer 39 of a suitable material such as aluminum is bonded to the lower surface of the substrate 13 to provide a ground connection for the filter.

The portion of the transversal filter 10 shown in FIGS. 1 and 2 and described above is a portion of main shift register of the transversal filter described and claimed in patent application Ser. No. 609,415 filed concurrently herewith and assigned to the assignee of the present invention. The aforementioned application Ser. No. 609,415 is incorporated herein by reference thereto. The manner in which packets of charge varying in accordance with an analog signal are serially applied to the input of the shift register 11, the manner in which the charge packets are clocked along the shift register and the manner in which charge is collected by a drain at the output of the shift register are described in the aforementioned application Ser. No. 609,415.

The manner in which packets of charge are transferred from stage to stage along the shift register of FIGS. 1 and 2 and the manner in which charge is sensed during such transfer will be described in connection with the output circuit of FIG. 3. The output circuit of FIG. 3 is identical to the output circuit of FIG. 9 of the aforementioned application Ser. No. 609,415. The manner in which the stages of shift register are weighted has been described above and is more fully described in the aforementioned patent application Ser. No. 609,415. It has also been pointed out above that the difference between the charge induced on the lines 24A and 24B represents the convolution of the samples of an analog input signal with the weighting factors of the various stages of the transversal filter as set forth in equation 1 above. To this end there is provided a high gain differential amplifier 40 having an inverting input terminal 41, a non-inverting input terminal 42 and an output terminal 43. The differential amplifier may be any of a variety of operational amplifiers commercially available, for example, operational amplifier LM318 available from National Semiconductor Company of Santa Clara, California. The inverting input terminal 41 is connected to first line 24A interconnecting the A parts of the $\phi_D$ electrodes 24 of FIG. 1. The output terminal 43 is connected to the inverting input terminal 41 through a feedback capacitance $C_{FB}$. The potential of the inverting terminal 41 of the high gain differential amplifier with capacitance feedback follows the potential of the non-inverting terminal 42 and delivers a voltage at the output terminal 43 which is proportional to the difference in induced charge on the input line 24A divided by the feedback capacitance $C_{FB}$. A first switchable impedance means in the form of a MOSFET transistor 45 is connected across the feedback capacitor $C_{FB}$. A source 46 of fixed voltage having its positive terminal connected to ground provides $\phi_D$ voltage. A second switchable impedance means in the form of another MOSFET transistor 47 is connected between the negative terminal of source 46 of $\phi_D$ voltage and the first line 24A. The transistor switches 45 and 46 are actuated by a reset voltage $\phi_R$, applied to the gates of the transistor switch is shown in FIG. 4 to periodically switch the impedance of the source to drain conduction path thereof between low and high values in a manner which will be explained below. A capacitor 49 is also connected between the non-inverting terminal 42 and the negative terminal of source 46. The capacitance 49 is equal to the capacitance of feedback capacitor $C_{FB}$ and is provided to maintain balance of capacitances on the two lines 24A to 24B to assure proper operation of the differential sensing circuit. It is assumed that the capacitances of lines 24A and 24B are substantially equal. If they are not, balance of the lines may be provided by use of the parallel shift register described in the aforementioned application Ser. No. 609,415. It should be noted that output terminal 43 has a relatively low impedance with respective to ground and is essentially at A-C ground.

A sampling circuit is connected between output terminal 43 and ground, and comprises a MOSFET transistor 51 connected in series with a sampling capacitor 52. The source to drain conduction path of the MOSFET transistor 51 is connected in series with the sampling capacitor 52. The gate electrode of the MOSFET transistor 51 is connected to a source of sampling pulses, such as shown in FIG. 4. The output appearing across the sampling capacitor 52 is applied to a source follower circuit 53 which includes a MOSFET transistor 54, the source to drain conduction path of which is connected in series between a source of operating potential $V_{DD}$ and ground through an output impedance 55. The sampling capacitor 52 is connected between the gate of transistor 54 and ground. A voltage waveform which is the inverse of the sample voltage waveform of FIG. 4 is applied to sampling capacitor 52 through coupling capacitor 56 to cancel feed through of the sample pulses applied to transistor 51.

The manner in which the circuit of FIG. 3 connected to the transversal filter of FIG. 1 derives an output which is a measure of the difference in charges induced on the A parts of electrodes 24 connected to line 24A and the B parts of electrodes 24 connected to line 24B in response to the transfer of charge to the storage regions lying thereunder will now be explained in connection with the waveform diagrams of FIG. 4. The $\phi_C$, $\phi_C'$ and $\phi_D'$ voltages are applied, respectively, to lines 26C, 28C and 28D from suitable sources (not shown). The voltage $\phi_D$ is applied to the lines 24A and 24B from a source 46. Packets of charge representing signal samples are introduced at the input of the transversal filter 10 and are clocked along the semiconductor surface from stage to stage of the filter as fully explained in the aforementioned patent application Ser. No. 609,415. However the manner in which charges are clocked along will now be briefly described in connection with FIGS. 1, 2 and 4. Typically, for an oxide thickness under the $\phi_C$ and $\phi_D$ electrodes 24 and 26 of about 1000 Angstrom Units and an oxide thickness under the $\phi_C'$ and $\phi_D'$ electrodes of about 2000 Angstrom Units, the voltage levels of the $\phi_C$ waveform are $-6$ and $-28$ volts, and the voltage levels of the $\phi_C'$ waveform are $-3$ and $-22$ volts. The voltage level of $\phi_D$ and $\phi_D'$ are, respectively, $-15$ and $-9$ volts. During the interval $t_0$-$t_1$ with the transfer gate voltage $\phi_C'$ at its least negative value, no charge is transferred from the storage sites underlying the $\phi_D$ electrodes to the storage sites underlying the $\phi_C$ electrodes. During the interval $t_1$-$t_2$ with the $\phi_C$ voltage and the transfer gate voltage $\phi_C'$ at their most negative values, charge is transferred from the storage sites underlying the $\phi_D$ electrodes to the storage sites underlying the $\phi_C$ electrodes. At a point in time between $t_3$ and $t_4$ the voltage applied to the $\phi_C$ and the $\phi_C'$ clock lines has decreased. Thus, the surface potentials of the storge regions underlying the $\phi_C$ electrodes 26 have been raised to a value above the surface potentials underlying $\phi_D$ electrodes 24 which are maintained at a constant value. Also, the surface potentials of the substrate underlying the $\phi_C'$ electrodes have been raised to a value above the surface potential of the substrate underlying the $\phi_D'$ electrodes which are maintained at a constant value. Accordingly, the charge in the potential well underlying the $\phi_C$ electrodes flows into the potential well underlying the $\phi_D$ electrodes. In order to assure transfer of charge in the potential wells underlying the $\phi_C$ electrodes to the potential wells underlying the $\phi_D$ electrodes, the voltage $\phi_C'$ is raised a short time earlier than the time of the rise in the $\phi_C$ voltage thereby establishing a barrier to the flow of charge in a direction opposite to the desired direction, i.e. the desired direction being from left to right in FIGS. 1 and 2. The shift registers of FIGS. 1 and 2, utilizing split electrodes which are maintained at a substantially fixed potential is particularly described and claimed in copending application Ser. No. 609,416 filed co currently herewith and assigned to assignee of the present invention. The aforementioned application Ser. No. 609,416 is incorporated herein by reference thereto.

Continuing with the explanation of the operation of the circuit of FIG. 3, the switches 45 and 47 are closed from a time $t_0$ to a time somewhat after $t_2$, as seen from the reset waveform $\phi_R$ of FIG. 4 applied to the gate of transistor 45, thereby shorting out feedback capacitor $C_{FB}$ and the capacitor 49, respectively. During this interval the potential at the input terminal 41 is equal to the potential on the output terminal 43 and the potential on input terminal 42. The potential on terminals 41, 42 and 43 of the differential amplifier would be essentially the potential of the $\phi_D$ source 46. At instant $t_3$, the $\phi_C$ voltage goes to its least negative value and thereby enables charge to be transferred from $\phi_C$ storage sites to the $\phi_D$ storage sites. The switches 45 and 46 are opened somewhat before $t_3$, as the reset voltage $\phi_R$ goes to zero at that time, and the lines 24A and 24B are floated. Charge transfer from the $\phi_C$ to the $\phi_D$ storage sites occurs during the interval $t_3$–$t_6$. When surface charge transfers from the $\phi_C$ to the $\phi_D$ sites, an opposing charge which is proportional to the transferred charge is induced in the $\phi_D$ lines 24A and 24B. As the capacitance of line 24A is the same as the capacitance of line 24B and as the lines are isolated from source 46, the charge transfer induces a voltage change on the lines proportional to the individual charges induced thereon. As the high gain differential amplifier has capacitance feedback to the inverting terminal, the inverting input terminal 41 follows the potential of the non-inverting terminal 42. Thus, a difference in induced charge on the first and second lines causes the amplifier to deliver charge from the output terminal to the inverting input terminal through the feedback capacitance to maintain equal voltage on the input terminals. Accordingly the difference in charge induced on the lines is represented by the change in voltages at the output terminal ($\Delta e_0$) times the feedback capacitance $C_{FB}$. Thus, the amplifier develops an output which is a measure of the difference in induced charge on the lines. As lines 24A and 24B are precharged and floated, the amplifier has the time interval from $t_3$ to the instant that the sample voltage returns to its most positive voltage (just before time $t_6$) to attain the correct output voltage. This allows essentially the maximum time for the amplifier to respond and hence imposes minimum requirements on amplifier performance. Sampling the change in output level of voltage provides a measure of the sum of the weighted samples of the analog signal. The output voltage is sampled after the charge transfer has been completed and during the interval $t_5$–$t_6$ by energizing the MOSFET transistor 51 to charge the sampling capacitor 52 and thereby obtain a sample voltage which is a measure of the difference in charge delivered to the lines 24A and 24B. The sampled voltage is applied to the gate of the source follower 53 from which the output is obtained. As some of the sample pulse applied to the gate of transistor 51 may feed through to the source follower, the inverse of the sample pulse voltage is applied to the gate of the source follower 53 to cancel such feedthrough. Actuation of the switch 45 at time $t_6$ after sampling has been accomplished causes the potential of terminal 41 to be fixed to the potential of the non-inverting terminal 42 by feedback action through the direct connection from the output terminal 43 to the inverting input 42 and also causes the feedback capacitance $C_{FB}$ to be completely discharged and readied for another sensing operation. Also, actuation of switch 47 at time $t_6$ connects line 24B to the source 46 and also discharges capacitance 49.

As the $\phi_D$ electrodes connected to lines 24A and 24B are capacitively coupled to the $\phi_C'$ electrodes, clocking voltage on the $\phi_C'$ electrodes feeds through to the lines 24A and 24B. As the signal varies, both the inverting terminal 41 and the non-inverting terminal 42 vary by the same amount and in the same direction when the coupling capacitances to the lines 24A and 24B are substantially the same. The amplifier 40 rejects this common mode signal. The effect of this feedthrough on the voltages of the $\phi_D$ electrodes may be minimized by adjusting the timing of the reset voltage to bypass this feedthrough to ground and thus improve the dynamic range of operation of the circuit.

Figure 5:
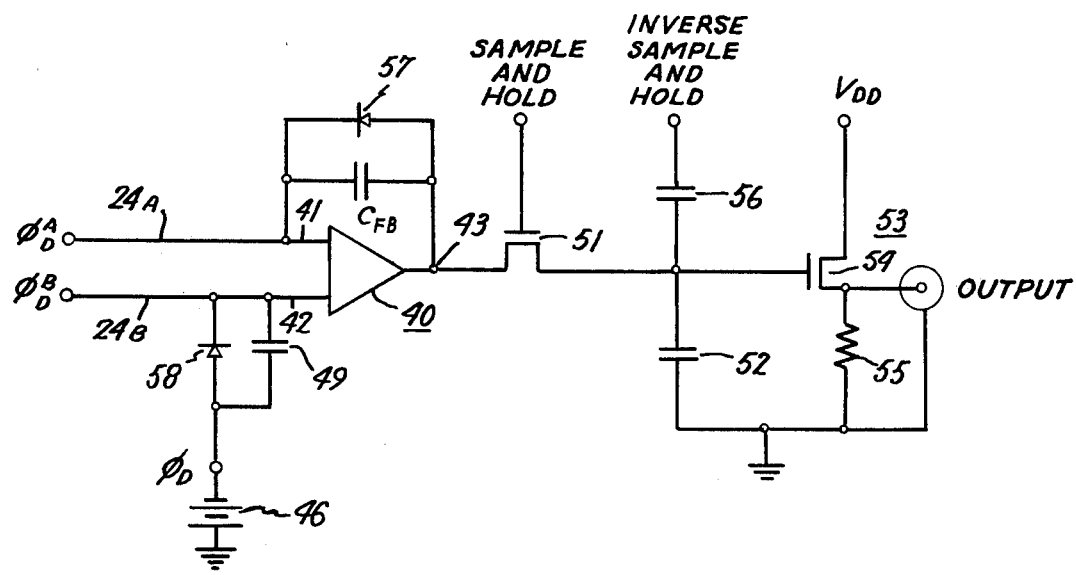
FIG. 5 is a schematic diagram of another embodiment of the differential output circuit in accordance with the present invention.

The circuit of FIG. 5 is similar to the circuit of FIG. 3 and identical elements have been identically designated. Unidirectionally conducting device or diode 57 having its anode connected to output terminal 43 and its cathode connected to inverting terminal 41 replaces the transistor 45. Unidirectionally conducting device or diode 58 having its anode connected to source 46 and its cathode connected to line 24B replaces the transistor 47. A feature of the replacement of the transistors by diodes to implement the precharging and floating of the $\phi_D$ electrodes as described below is that the diodes introduce a minimum amount of additional noise to the circuit. In the operation of the circuit the clock voltages coupled to the $\phi_D$ electrodes and hence appearing on lines 24A and 24B are utilized to render the diodes 57 and 58, respectively, simultaneously conductive and thereafter simultaneously nonconductive, and hence clamp the lines 24A and 24B to the voltage $\phi_D$ of source 46. Note that with diode 57 conducting, output terminal 43 is connected to inverting input terminal 41 which follows the potential of non-inverting terminal 42. In the transversal filter structure of FIGS. 1 and 2 the clock voltage appearing on the lines 24A and 24B is coupled thereto principally through the interelectrode capacitances of the $\phi_C'$ electrodes with respect to the $\phi_D$ electrodes and may be several volts. Because of this capacitive coupling between the $\phi_C'$ electrodes and the split $\phi_D$ electrodes 24, the voltages on the two parts of the split $\phi_D$ electrodes and hence on the lines 24A and 24B will try to follow the $\phi_C'$ voltage. At the time $t_1$ the voltage $\phi_C'$ (FIG. 4) drops to its most negative value and charge transfer is initiated from the storage sites underlying the $\phi_D$ electrodes to the storage sites underlying the $\phi_C$ electrodes. At time $t_1$ the voltage on the $\phi_D$ electrodes will also tend to go more negative and a voltage level will be reached at which diode 58 will conduct and clamp this voltage substantially to the voltage $\phi_D$ of source 46. (Note that the diode 58 has a certain forward voltage drop). Similarly, diode 57 will conduct and allow the amplifier 40 to reset the voltage on lie 24A to the voltage $\phi_D$ on line 24B. When the voltage $\phi_C'$ goes to its most positive value at $t_2$ in preparation for the transfer of charge from the storage sites underlying the $\phi_C$ electrodes to the storage sites underlying the $\phi_D$ electrodes the diodes 57 and 58 are cut off as the cathodes of these devices now become more positive than the anodes thereof. The $\phi_D$ electrodes are thus precharged and floated. During the interval $t_3$–$t_6$ charge is transferred from the storage sites underlying the $\phi_C$ electrode to the storage sites underlying the electrodes. As explained above, the difference in induced charge on the first and second lines causes the amplifier to deliver charge from the output terminal 43 to the inverting input terminal 41 through the feedback capacitance to maintain equal voltage on the input terminals. Thus, the difference in charge induced on the lines produces a proportional change in voltage at the output terminal of the amplifier. Sampling the change in output level of voltage provides a measure of the sum of the weighted samples of the analog signal. The output voltage of the amplifier 40 is sampled after the charge transfer has been completed and during the interval $t_5$–$t_6$ by energizing the MOSFET transistor 51 to charge the sampling capacitor 52 and thereby obtain a sample voltage which is a measure of the difference in charge delivered to the lines 24A and 24B as explained above.

While the differential read out circuit of the present invention has been shown and described in connection with a charge transfer transversal filter operated in a one phase mode, it is apparent that the filter may be operated in other modes, i.e. two or more phase modes.

While the differential read out circuit of the present invention has been shown and described in connection with a filter which included transfer electrodes in addition to the storage electrodes, it is readily apparent that the transfer electrodes 28 could be eliminated, if desired, and the electrodes 24 and 26 coupled sufficiently close together along the length thereof to provide either a one phase or a two phase shift register to enable detection of the transfer of charge. In such a case in connection with the circuit of FIG. 5 the voltages coupled from the storage electrodes adjacent the split electrodes would be utilized for alternately actuating the diodes thereof.

It is also apparent that whereas the filter has been described in terms of a "p-channel" device, i.e. a device in which the stored charge is in the form of positive charge carriers or "holes", an "n-channel" device may be similarly constructed by methods well known to those skilled in the art. In the "n-channel" device the stored and transferred charge is in the form of negatively charged carriers or electrons. This necessitates operation of the device with potentials of the opposite sign. In connection with the circuit of FIG. 5 the polarities of the diodes 57 and 58 would be reversed.

While the invention has been described in connection with a particular transversal filter, it is apparent that the invention is equally applicable to other charge transfer apparatus for sensing difference in charge by means of a pair of lines connected to pluralities of electrodes of charge transfer device, for example, the correlator apparatus of U.S. Pat. No. 3,801,883, assigned to the assignee of the present invention. The aforementioned patent is incorporated herein by reference thereto. The lines 24A and 24B of FIG. 3 of this patent application may be connected respectively to terminals 45 and 46 of the correlator apparatus of FIG. 4 of U.S. Pat. No. 3,801,883 to provide an output which is the difference in induced charge on lines $\phi_1$ (A) and $\phi_1$ (B) thereof. Of course, the other phase related voltage would be applied to the $\phi_2$ line.

While the invention has been described in specific embodiments it will be appreciated that modifications, such as those described above, may be made by those skilled in the art and it is intended by the appended claims to cover all such modifications and changes as fall within the true spirit and scope of the invention.

What we claim as new and desire to secure by Letters Patent of the United States is:

1. A transversal filter comprising
   a substrate of semiconductor material of one conductivity type,
   a first plurality of electrodes insulatingly overlying said substrate, each split into a first and a second part with a gap therebetween,
   a second plurality of electrodes insulatingly overlying said substrate, each spaced between adjacent electrodes of said first plurality, said first and second pluralities of electrodes forming a plurality of stages of a shift register,
   means for connecting the first parts of said electrodes of said first plurality to a first conductive line,
   means for connecting the second parts of said electrodes of said first plurality to a second conductive line,
   means for introducing packets of charge representing successive samples of an analog signal into said shift register,
   charge clocking means to effect the transfer of charge from storage region to storage region underlying said first and said second pluralities of electrodes including means for applying first and second phase related voltages to said first and said second pluralities of electrodes respectively, said first voltage being applied to said first and said second lines, said second voltage having a predetermined periodicity,
   differential sensing means connected to said first and second lines for detecting a difference in signal on said lines in response to the transfer of charge from storage regions underlying said second plurality of electrodes to storage region underlying said first plurality of electrodes for obtaining a sum of weighted samples of said analog signal including
   a high gain differential amplifier having a pair of input terminals and an output terminal, one of said input terminals being an inverting input terminal and the other being a non-inverting terminal, a first capacitor, said inverting terminal connected to said output terminal through said first capacitor and also connected to said first line, said non-inverting terminal connected to said second line,
   a source of said first phase related voltage,
   first and second diodes, said first diode connected between said first line and said output terminal, said second diode connected between said second line and said source, said first and second diodes being poled so as to be rendered conductive periodically during a period prior to transfer of charge from the storage regions underlying said second plurality of electrodes to the storage regions underlying said first plurality of electrodes and rendered non-conductive during a time including the time of transfer of charge from the storage regions underlying said second plurality of electrodes to the storage regions underlying said first plurality of electrodes in response to said second phase related voltage on said second plurality of electrodes capacitively coupled to said first plurality of electrodes,
   whereby each of said lines is charged to substantially the value of said first phase related voltage of said source periodically prior to the transfer of charge into the storage regions underlying said first plurality of electrodes and thereafter said lines are isolated from said source, and charge periodically transferred from the storage regions underlying said second plurality of electrodes to storage regions underlying said first plurality of electrodes induces different voltages on said lines and causes the voltage of the inverting terminal to follow the voltage of the noninverting terminal by virtue of the feedback through said first capacitor and a total charge is supplied to said first capacitor which is proportional to the difference in charge delivered to said lines during said transfer of charge, said total charge appearing as a change in voltage at said output terminal.

2. The filter of claim 1 in which said source of a first phase related voltage is a source of a fixed d-c voltage having a positive terminal connected to ground, in which said substrate is of N-type conductivity, in which the anode of said first diode is connected to said output terminal and the cathode thereof is connected to said inverting terminal, and in which the anode of said second diode is connected to the negative terminal of said source and the cathode thereof is connected to said second line, whereby during the transfer of charge into the storage regions underlying said first plurality of electrodes clocking voltages coupled to said lines raise the voltage on said lines to render said diodes non-conductive.

3. The filter of claim 1 in which said source of a first phase related voltage is a source of a fixed d-c voltage having a negative terminal connected to ground, in which said substrate is of P-type conductivity, in which the cathode of said first diode is connected to said output terminal and the anode thereof is connected to said inverting terminal, and in which the cathode of said second diode is connected to the positive terminal of said source and the anode thereof is connected to said second line, whereby during the transfer of charge into the storage regions underlying said first plurality of electrodes clocking voltages coupled to said lines lowers the voltage on said lines to render said diodes non-conductive.

4. The transversal filter of claim 1 in which the pair of storage regions underlying said first and second parts of each of said first plurality of electrodes are coupled together to provide equal charge densities therein when said electrodes are maintained at said voltage of the inverting terminal by means of said feedback.

5. The transversal filter of claim 4 in which said coupling is provided by means of a region of opposite conductivity type in said substrate contiguous to said storage regions.

6. A transversal filter comprising
- a substrate of semiconductor material of one conductivity type,
- a first plurlity of electrodes insulatingly overlying said substrate, each split into a first and a second part with a gap therebetween,
- a second plurality of electrodes insulatingly overlying said substrate, each spaced between adjacent electrodes of said first plurality, said first and second pluralities of electrodes forming a plurality of stages of a shift register,
- means for connecting the first parts of said electrodes of said first plurality to a first conductive line,
- means for connecting the second parts of said electrodes of said first plurality to a second conductive line,
- means for introducing packets of charge representing successive samples of an analog signal into said shift register,
- charge clocking means to effect the transfer of charge from storage region to storage region underlying said first and said second pluralities of electrodes including means for applying a first fixed voltage to said first plurality of electrodes and for applying a first pulsating voltage to said second plurality of electrodes, said first fixed voltage being applied to said first and said second lines, said first pulsating voltage having a predetermined periodicity,
- a plurality of transfer electrodes, each insulatingly overlying a respective adjacent pair of electrodes of said first plurality and said second plurality of electrodes, alternate ones of said transfer electrodes being interconnected to form a first plurality and a second plurality of transfer electrodes, means for applying a second fixed voltage to said first plurality of transfer electrodes, means for applying a second pulsating voltage to said second plurality of transfer electrodes, means for synchronizing said first and second pulsating voltages, said second fixed voltage being of a value in relation to said first fixed value of voltage and the levels of said second pulsating voltage being set in relation to the levels of said first pulsating voltage to enable charge to be transferred from storage regions of said second plurality to storage regions of said first plurality under the control of the level of potential on said second plurality of transfer electrodes,
- differential sensing means connected to said first and second lines for detecting a difference in signal on said lines in response to the transfer of charge from storage regions underlying said second plurality of electrodes to storage region underlying said first plurality of electrodes for obtaining a sum of weighted samples of said analog signal including
- a high gain differential amplifier having a pair of input terminals and an output terminal, one of said input terminals being an inverting input terminal and the other being a non-inverting terminal, a first capacitor, said inverting terminal connected to said output terminal through said first capacitor and also connected to said first line, said non-inverting terminal connected to said second line,
- a source of said first fixed voltage,
- first and second diodes, said first diode connected between said first line and said output terminal, said second diode connected between said second line and said source, said first and second diodes being poled so as to be rendered conductive periodically during a period prior to transfer of charge from the storage regions underlying said second plurality of electrodes to the storage regions underlying said first plurality of electrodes and rendered non-conductive during a time including the time of transfer of charge from the storage regions underlying said second plurality of electrodes to the storage regions underlying said first plurality of electrodes in response to said second pulsating voltage on said second plurality of transfer electrodes capacitively coupled to said first plurality of electrodes,
- whereby each of said lines is charged to substantially the value of said first fixed voltage of said source periodically prior to the transfer of charge into the storage regions underlying said first plurality of electrodes and thereafter said lines are isolated from said source, and charge periodically transferred from the storage regions underlying said second plurality of electrodes to storage regions underlying said first plurality of electrodes induces different voltages on said lines and causes the voltage of the inverting terminal to follow the voltage of the non-inverting terminal by virtue of the feedback through said first capacitor and a total charge is supplied to said first capacitor which is proportional to the difference in charge delivered to said lines during said transfer of charge, said total charge appearing as a change in voltage at said output terminal.

* * * * *